United States Patent [19]
Shin et al.

[11] Patent Number: 5,844,305
[45] Date of Patent: Dec. 1, 1998

[54] LEAD FRAME FOR SEMICONDUCTOR DEVICES

[75] Inventors: Young Eui Shin, Kyungki-do; Kyung Seob Kim, Seoul; Min Bin Yim, Choogcheongnam-do, all of Rep. of Korea

[73] Assignee: Samsung Electronics Co., Ltd., Suwon, Rep. of Korea

[21] Appl. No.: 371,703

[22] Filed: Jan. 12, 1995

[30] Foreign Application Priority Data

Jan. 13, 1994 [KR] Rep. of Korea ............... 1994-516

[51] Int. Cl.$^6$ ............... H01L 23/495; H01L 23/48; H01L 23/28
[52] U.S. Cl. ............... 257/676; 257/666; 257/677; 257/741; 257/784; 257/796
[58] Field of Search ............... 257/676, 696, 257/741, 784, 666, 796, 677

[56] References Cited

U.S. PATENT DOCUMENTS

| | | | |
|---|---|---|---|
| 4,673,967 | 6/1987 | Hingorany | 257/676 |
| 5,134,459 | 7/1992 | Maeda et al. | 257/677 |
| 5,276,351 | 1/1994 | Yamazaki et al. | 257/666 |
| 5,329,158 | 7/1994 | Lin | 257/666 |
| 5,360,991 | 11/1994 | Abys et al. | 257/666 |
| 5,455,446 | 10/1995 | Suppelsa et al. | 257/467 |

Primary Examiner—Valencia Martin Wallace
Attorney, Agent, or Firm—Jones & Volentine, L.L.P.

[57] ABSTRACT

A lead frame for a semiconductor device, comprising; a die pad having a major surface upon which a semiconductor die is placed, the major surface being clad with a metal layer, an inner lead portion electrically connected to the semiconductor die, wherein the die pad and the inner lead portion are embedded within a molding resin, and an outer lead portion exposed outside the molding resin, electrically connected to the inner lead portion, and adapted for connection to a printed circuit board land, wherein the die pad, inner lead portion, and outer lead portion are formed from a metal having a thermal expansion coefficient equal to that of the printed wiring board land.

6 Claims, 1 Drawing Sheet

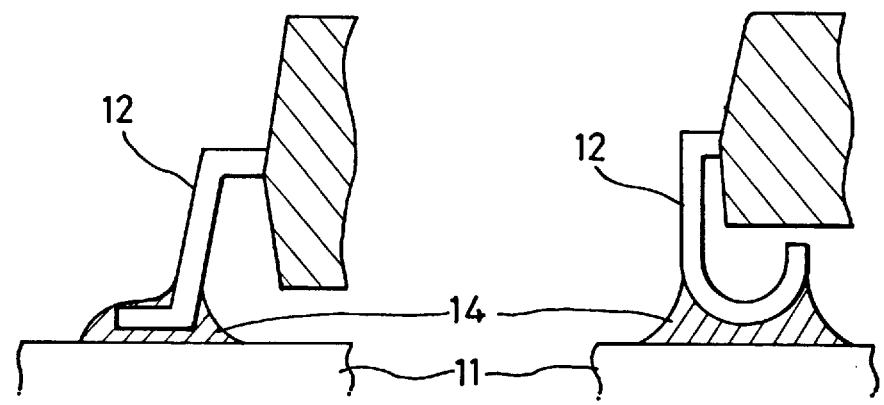
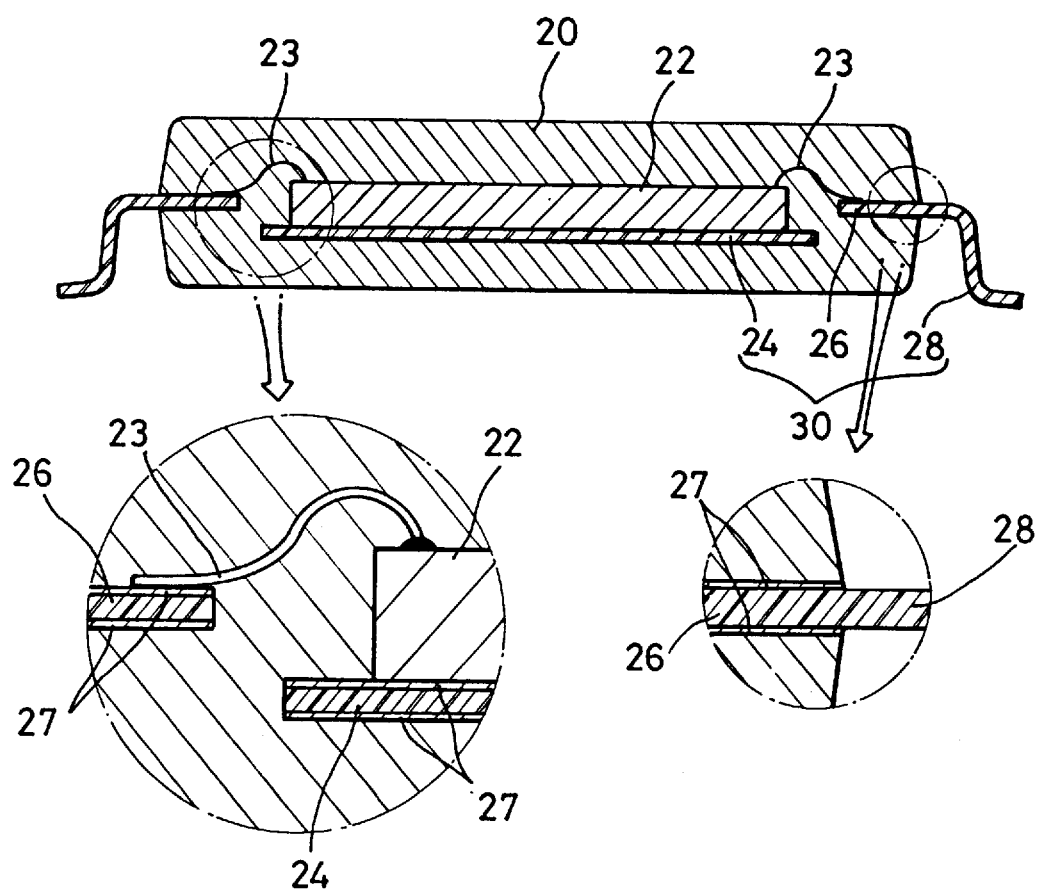

LEAD FRAME FOR SEMICONDUCTOR DEVICES

BACKGROUND OF THE INVENTION

The present invention relates to lead frames for semiconductor devices. More particularly, the present invention relates to a lead frame which is relatively immune to solder joint cracks caused by the difference in thermal expansion coefficients between an outer portion of the lead frame and a land on a printed circuit board (PCB).

Current semiconductor devices are highly integrated and are generally characterized by increased memory capacity, greater power consumption, increased signal processing speeds. In particular, highly integrated semiconductor memory devices require an increasing number of input/output contact terminals, and consequently an increasing number of leads. The foregoing trends in semiconductor development place increasing demands on semiconductor packaging designs and packaging techniques. Thus, improvements in semiconductor packaging have become the subject of intense research and development.

Conventional semiconductor devices are packaged such that a semiconductor die containing integrated circuits is attached or mounted onto a die pad. The die pad is part of a lead frame typically made of alloys such as nickel-iron. Bonding pads on the semiconductor die are connected by bonding wires to respective inner lead portions of the lead frame. The inner lead portions, the die pad, and die are embedded in an insulating, molding compound, such as epoxy. Outer lead portions connected to the inner lead portions of the lead frame extends outside the molding resin.

Outer lead portions are respectively used to connect the resin embedded "package" to an external environment; typically to a PCB, and more typically to an electrically conductive land on a PCB. Corrosion of the outer lead portion, which is exposed outside the molding resin, can be avoided by coating the lead with well known resins.

Conventional leads, inner and outer portions, have become finely pitched. Conventional outer lead portions have a variety of structures including through hole(TH) types which use dual in-line package(DIP), surface mount types (SMT) which use gull wing leads of small out line package(SOP) and quad flat package(QFP), and J-bend lead types which use small out-line J-bend package and plastic leaded chip carrier(PLCC).

The outer lead portion may be soldered to an electrode pad on a hybrid integrated circuit made of silver and platinum. Alternately, the outer lead portion is soldered to a copper land on a PCB. The nickel-iron alloys commonly used to make lead frames are mechanical strong, resistant to heat and acids, and enjoy excellent bonding properties between the molding resin and the bonding wire. However, the electrical or thermal conductivities of the nickel-iron alloy are different from the copper land pad.

It is common in multi-chip module or hybrid device technologies for semiconductor packages having lead frames made of nickel-iron alloys mounted on PCBs to be subjected to reliability tests such as exposure to high temperature, and/or to temperature cycling. As shown in FIG. 1, a solder joint 14 between a PCB land 11 and an outer lead portion 12 of the lead frame receives considerable shearing stress during such testing. This stress results from the difference in thermal expansion coefficients between the copper PCB land, the nickel-iron outer lead portion. Generally, the thermal expansion coefficient for nickel-iron alloys is $4 \times 10^{-6}/°C$. The thermal expansion coefficient for the copper PCB land is $16 \times 10^{-6}/°C$. Finally, the thermal expansion coefficient for the PCB itself is around 15 to $17 \times 10^{-6}/°C$. The stresses caused by temperature cycling test are particularly harsh, and often cause deformations in the junction between leads and lands.

This problem of lead/land joint fracturing (cracking) under thermal stress did not arise in past generations of semiconductor devices because joint areas were large enough to allow substantial deformation without fracture. This is, however, no longer the case. In particular, joints attaching ever finer leads to lands prove less and less able to withstand thermal stress deformations. Accordingly, the reliability of denser semiconductor devices has become particularly suspect.

SUMMARY OF THE INVENTION

In view of the foregoing, it is an object of the present invention to provide a semiconductor lead frame made from a metal having a thermal expansion coefficient similar to that of a PCB land.

It is another object of the present invention to provide a copper lead frame for a semiconductor device comprising an inner lead portion and a die pad, wherein the major surfaces of the die pad and the inner lead portion are clad with a metal layer of nickel-iron or tin-lead(Pb) alloys having a thickness in the range of from 10 to 40% the thickness of the lead frame.

The foregoing objects are achieved by a lead frame for a semiconductor device manufactured according to the present invention and comprising; a die pad having a major surface upon which a semiconductor die is placed, the major surface being clad with a metal layer, an inner lead portion electrically connected to the semiconductor die, wherein the die pad and the inner lead portion are embedded within a molding resin, and an outer lead portion exposed outside the molding resin, electrically connected to the inner lead portion, and adapted for connection to a printed circuit board land, wherein the die pad, inner lead portion, and outer lead portion are formed from a metal having a thermal expansion coefficient equal to that of the printed wiring board land.

BRIEF DESCRIPTION OF THE DRAWINGS

A complete understanding of the present invention and its accompanying advantages, along with its making and use, may be had by reference to the following detailed description, taken in conjunction with the accompanying drawings in which:

FIG. 1 is a cross-sectional view of solder joints between PCB lands and an outer lead portion of lead frames having a gull-wing type lead(left), and J-bend type lead (right); and, FIG. 2 is a cross-sectional view of the semiconductor package using a lead frame in accordance with the present invention.

DETAILED OF THE INVENTION

Reference is made to FIG. 2, which is a cross-sectional view of a semiconductor package manufactured according to the present invention. In FIG. 2, a semiconductor die 22 having bonding pads, bonding wires 23, a die pad 24, and inner lead portions 26 of lead frame 30 are embedded in a molding resin 20. Outer lead portions 28 of the lead frame 30 extend beyond and are thus exposed outside molding resin 20. Molding resin 20 may be any one of a number of conventional resins employed to encase semiconductor devices.

Lead frame 30 comprises die pad 24, inner lead portions 26, and outer lead portions 28. Throughout the specification, the term "inner lead portion" 26 means a part of lead frame 30, other than die pad 24, embedded in molding resin 20. Similarly, the term "outer lead portion" 28 means a part of lead frame 30 extending outside the molding resin 20. Within the present invention, lead frame 30 is preferably comprised of copper, or similar metal or metal alloy compatible with the PCB land.

In one aspect of the present invention a metal layer 27 formed from, for example, a nickel-iron or a stannum-lead (Pb) alloy is clad onto the surface of inner lead portion 26 and onto the major surfaces of die pad 24. These alloys typically have a relatively low melting point of 180° C. or less. The metal layer 27 may be formed on the foregoing lead frame portions by a thermocompression bonding process. The thickness of metal layer 27 is preferably in the range of from 10 to 40% the thickness of lead frame 30.

As described above, lead frames manufactured according to the present invention comprise copper outer lead portions 28 having a thermal expansion coefficient "equal" to the that of the PCB lands to which the outer lead portions are subsequently connected. By "equal" those of ordinary skill in the art will recognize that the present invention does not teach an exact mathematical equivalence. Rather, lead frame 30 of the present invention is formed from a selection of metals which in there combination have a thermal expansion coefficient which is sufficiently similar to that of the PCB land such that thermal stress fracturing and critical deformation at the lead/land joint is eliminated.

Thus, the combination of metal layer 27 clad surface of copper inner lead portions 26 of lead frame 30 provides acceptable mechanical strength while also providing relief to the thermal stressing caused by the difference of thermal expansion coefficients between inner lead portions and PCB lands. Additionally, the metal layer 27 clad to die pad 24 and inner lead portions 26 enhances adhesion of lead frame 30 to molding resin 20. This improved adhesion prevents water/contaminant penetration into the package through the adhesion interfaces between lead frame 30 and molding resin 20. Such penetration may occur when a copper lead frame is embedded in the resin molding because of the formation of oxidation layers on the copper lead frame.

Accordingly, the lead frames in accordance with the present invention are advantageous in that they prevent formation of solder joint cracks due to the difference in thermal expansion coefficients between outer lead portions and PCB lands. Furthermore, the present invention provides enhanced adhesion of lead frame to the molding resin and reduced difference of thermal expansion coefficients between the lead frame and the molding resin, thereby preventing heel brakes, package delaminations, cracks or the like. Thus, semiconductor devices employing the lead frame enjoy increased reliability.

Lead frames manufactured according to the present invention can appropriately be employed in very dense surface mount semiconductor devices, such as multi-chip modules or hybrid devices. Although the present invention has been illustrated with reference to the lead frames wherein both upper and lower surfaces of die pad 24, as well as inner and outer lead portions 26 and 28, are clad with nickel-iron alloys of tin-lead alloys, it should be understood that the lead frames wherein only the upper surface of die pad 24, or a predetermined portion of leads are clad with metal layer 27 are also contemplated by the present invention. Furthermore, although the present invention has been described with respect to a specific embodiment, various changes and modifications will be apparent to those skilled in the art. The foregoing embodiment is given by way of example. The present invention is not limited to this embodiment, but encompasses all variations falling within the scope of the appended claims.

What is claimed is:

1. A lead frame for a semiconductor device adapted to be connected to a printed circuit board land, comprising:

a die pad upon which a semiconductor die is placed;

an inner lead portion having a first thickness, electrically connected to the semiconductor die, wherein the die pad and the inner lead portion are embedded within a molding resin, and wherein the die pad and the inner lead portion are clad with a metal layer formed of a nickel-iron alloy having a second thickness in a range of from 10% to 40% the first thickness; and an outer lead portion electrically connected to the inner lead portion, and formed from a metal having a thermal expansion coefficient equal to that of the printed circuit board land, the outer lead portion extending outside the molding resin, such that the outer lead portion is exposed to an external environment.

2. The lead frame of claim 1, wherein the metal forming the die pad, inner lead portion, and outer lead portion is one selected from a group consisting of copper and copper alloy.

3. The lead frame of claim 1, wherein the metal layer is formed from an alloy having a melting point less than 180° C.

4. The lead frame of claim 1, wherein the metal layer is thermal compression bonded to at least said inner lead portion.

5. The lead frame of claim 2, wherein the metal layer is thermal compression bonded to at least said inner lead portion.

6. The lead frame of claim 3, wherein the metal layer is thermal compression bonded to at least said inner lead portion.

\* \* \* \* \*